(12) United States Patent
Zhao et al.

(10) Patent No.: US 9,722,094 B2
(45) Date of Patent: Aug. 1, 2017

(54) TFT, ARRAY SUBSTRATE AND METHOD OF FORMING THE SAME

(71) Applicants: Shenzhen China Star Optoelectronics Technology Co., Ltd., Shenzhen, Guangdong (CN); Wuhan China Star Optoelectronics Technology Co., Ltd., Wuhan, Hubei (CN)

(72) Inventors: Mang Zhao, Guangdong (CN); Gui Chen, Guangdong (CN)

(73) Assignees: Shenzhen China Star Optoelectronics Technology Co., Ltd, Shenzhen, Guangdong (CN); Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 114 days.

(21) Appl. No.: 14/783,802

(22) PCT Filed: Sep. 9, 2015

(86) PCT No.: PCT/CN2015/089221
§ 371 (c)(1),
(2) Date: Oct. 9, 2015

(87) PCT Pub. No.: WO2017/035851
PCT Pub. Date: Mar. 9, 2017

(65) Prior Publication Data
US 2017/0148921 A1  May 25, 2017

(30) Foreign Application Priority Data
Aug. 31, 2015 (CN) .......................... 2015 1 0547997

(51) Int. Cl.
*H01L 29/786* (2006.01)
*H01L 29/423* (2006.01)
*H01L 29/66* (2006.01)

(52) U.S. Cl.
CPC .. *H01L 29/78696* (2013.01); *H01L 29/42384* (2013.01); *H01L 29/66757* (2013.01); *H01L 29/78621* (2013.01); *H01L 29/78675* (2013.01)

(58) Field of Classification Search
None
See application file for complete search history.

(56) References Cited

U.S. PATENT DOCUMENTS

| 5,693,959 A | * | 12/1997 | Inoue | H01L 29/78645 257/336 |
| 2003/0001157 A1 | * | 1/2003 | Yamada | H01L 21/2026 257/59 |

* cited by examiner

*Primary Examiner* — Angel Roman
*Assistant Examiner* — Kevin Quinto
(74) *Attorney, Agent, or Firm* — Andrew C. Cheng

(57) ABSTRACT

The present invention proposes a TFT, an array substrate, and a method of forming a TFT. The TFT includes a substrate, a buffer layer, a patterned poly-si layer, an isolation layer, a gate layer, and a source/drain pattern layer. The poly-si layer includes a heavily doped source and a heavily doped drain, and a channel. The gate layer includes a first gate area and a second gate area. The source/drain pattern layer includes a source pattern, a drain pattern and a bridge pattern, with the source pattern electrically connecting the heavily doped source, the drain pattern electrically connecting the heavily doped drain, and one end of the bridge pattern connecting the first gate area and the second gate area. The driving ability of the present inventive TFT is enhanced without affecting the leakage current.

13 Claims, 5 Drawing Sheets

TFT, ARRAY SUBSTRATE AND METHOD OF FORMING THE SAME

BACKGROUND OF THE INVENTION

1. Field of the Invention

The present invention relates to liquid crystal technology field, more particularly to a low temperature poly-silicon TFT based on dual-gate structure, an array substrate, and a method for manufacturing the TFT.

2. Description of the Prior Art

Low temperature poly-silicon (LTPS) is characterized by high carrier mobility. This characteristic is the backbone of development of LTPS thin film transistors (TFT). Designing associated integrated circuits (ICs) around a panel has been focused, and intensive research has been given to system on panel (SOP) technology. However, the characteristic of high carrier mobility of LTPS has made LTPS prone to current leakage in contrast to A-Si. Current leakage has become a critical issue of LTPS design.

Please refer to FIG. 1, showing a schematic diagram of a conventional LTPS N-TFT. The LTPS N-TFT includes a base 10, a buffer layer 11, a patterned ploy-silicon layer 12, an isolating layer 13, a gate layer 14, an insulating layer 15, and a source-drain layer 16. The patterned ploy-silicon layer 12 comprises a heavily doped source region 121 on one side, a heavily doped drain region 122 on the other side, and a channel 120 therebetween.

Electric current characteristics of a conventional LTPS TFT is highly influenced by the processes of forming ploy-silicon. The junction characteristic of ploy-silicon affects directly current leakage, threshold swing, and threshold voltage of LTPS TFT. In contrast to A-Si, the electric current and conductivity of the LTPS TFT are better due to higher mobility. However, the higher mobility causes more current leakage, thereby damaging operation of the component.

Refer to FIG. 2 showing a structure diagram of a conventional Lightly Doped Drain (LDD) Single-Gate N-type thin film transistor (N-TFT). The LDD Single-Gate N-TFT comprises two LDDs 223 between a heavily doped source 221 and a channel 220, and between a heavily doped drain 222 and the channel 220, respectively. The two LDDs 223 widen potential barriers between the source and channel 220 and between the drain and the channel 220.

The LDD 223 forms an intensity buffer causing a high resistance across the source-drain, so as to reduce a gradient of the electric field on the edge of the drain, reducing leakage current and avoiding hot carrier effect. Accordingly, the TFT as shown in FIG. 2 can leakage current of the component. Nevertheless, the TFT shown in FIG. 2 can not effectively reduce leakage current resulting from higher mobility. Specifically, leakage current is not neglectable in case that the characteristic of the component has been worse due to a long time use.

Refer to FIG. 3 showing a structure diagram of a conventional Lightly Doped Drain (LDD) Dual-Gate N-type thin film transistor. The Dual-Gate N-TFT comprises a gate layer 34 with a first gate area 341 and a second gate area 342. The Dual-Gate N-TFT increases a length of the channel between the source and drain, effectively reducing the leakage current of the component. Such Dual-Gate N-TFT which has driving ability as the component shown in FIG. 2 is widely used in LCD devices, but its driving ability is poorer than the component shown in FIG. 1 due to the existence of the LDDs.

SUMMARY OF THE INVENTION

The present invention provides a thin-film transistor (TFT), an array substrate and a method of forming the TFT so to solve the existing technical problem, which is the difficulty of raising the driving ability of TFT without affecting the leakage current.

According to the present invention, a thin-film transistor (TFT) comprises a substrate, a buffer layer on the substrate, a patterned polycrystalline silicon (poly-si) layer disposed on the buffer layer, an isolation layer covered on the patterned poly-si layer, a gate layer disposed on the isolation layer, and a source/drain pattern layer disposed on the insulating layer. The poly-si layer comprises a heavily doped source and a heavily doped drain disposed respectively on one of the two outer sides of the patterned poly-si layer, and a channel that is between the heavily doped source and the heavily doped drain. The gate layer comprises a first gate area and a second gate area disposed in parallel and corresponding to the channel. The source/drain pattern layer comprises a source pattern, a drain pattern and a bridge pattern, with the source pattern electrically connecting the heavily doped source, the drain pattern electrically connecting the heavily doped drain, and one end of the bridge pattern connecting the first gate area, and the other end of the bridge pattern connecting the second gate area.

Furthermore, the patterned poly-si layer further comprises a first lightly doped drain (LDD) area, a second LDD area, and a third LDD area, with the first LDD area locating on the internal side of the heavily doped source and electrically connecting the heavily doped source area, and the second LDD area locating on the internal side of the heavily doped drain and electrically connecting the heavily doped drain. The channel comprises a first channel area and a second channel area, with the first channel area locating on the internal side of the first LDD area and electrically connecting the first LDD area, the second channel area locating on the internal side of the second LDD area and electrically connecting the second LDD area, the third channel locating between the first channel area and the second channel area, and the third LDD area electrically connecting the first channel area and the second channel area.

Furthermore, a first via hole is formed on the insulating layer on the spot corresponding to the first gate area and the second gate area. The first via hole is stuffed with conductive materials, by which the bridge pattern connects the first gate area and second gate area.

Furthermore, the bridge pattern completely covers the first gate area and the second gate area.

Furthermore, a source via hole is formed on the isolation layer and the insulating layer on the spot corresponding to the heavily doped source. The source via hole is stuffed with conductive materials, by which the source pattern electrically connects the heavily doped source. A drain via hole is formed on the isolation layer and the insulating layer on the spot corresponding to the heavily doped drain. The drain via hole is stuffed with conductive materials, by which the drain pattern electrically connects the heavily doped drain.

According to the present invention, an array substrate comprises a thin-film transistor (TFT). The TFT comprises a substrate, a buffer layer on the substrate, a patterned polycrystalline silicon (poly-si) layer disposed on the buffer layer, an isolation layer covered on the patterned poly-si layer, a gate layer disposed on the isolation layer, and a source/drain pattern layer disposed on the insulating layer. The poly-si layer comprises a heavily doped source and a heavily doped drain disposed respectively on one of the two outer sides of the patterned poly-si layer, and a channel that is between the heavily doped source and the heavily doped drain. The gate layer comprises a first gate area and a second gate area disposed in parallel and corresponding to the channel. The source/drain pattern layer comprises a source pattern, a drain pattern and a bridge pattern, with the source pattern electrically connecting the heavily doped source, the drain pattern electrically connecting the heavily doped drain, and one end of the bridge pattern connecting the first gate area, and the other end of the bridge pattern connecting the second gate area.

Furthermore, the patterned poly-si layer further comprises a first lightly doped drain (LDD) area, a second LDD area, and a third LDD area, with the first LDD area locating on the internal side of the heavily doped source and electrically connecting the heavily doped source area, and the second LDD area locating on the internal side of the heavily doped drain and electrically connecting the heavily doped drain. The channel comprises a first channel area and a second channel area, with the first channel area locating on the internal side of the first LDD area and electrically connecting the first LDD area, the second channel area locating on the internal side of the second LDD area and electrically connecting the second LDD area, the third channel locating between the first channel area and the second channel area, and the third LDD area electrically connecting the first channel area and the second channel area.

Furthermore, a first via hole is formed on the insulating layer on the spot corresponding to the first gate area and the second gate area. The first via hole is stuffed with conductive materials, by which the bridge pattern connects the first gate area and second gate area.

Furthermore, the bridge pattern completely covers the first gate area and the second gate area.

Furthermore, a source via hole is formed on the isolation layer and the insulating layer on the spot corresponding to the heavily doped source. The source via hole is stuffed with conductive materials, by which the source pattern electrically connects the heavily doped source. A drain via hole is formed on the isolation layer and the insulating layer on the spot corresponding to the heavily doped drain. The drain via hole is stuffed with conductive materials, by which the drain pattern electrically connects the heavily doped drain.

According to the present invention, a method of forming the TFT comprises forming a buffer layer on a substrate, forming a patterned polycrystalline silicon (poly-si) layer on the buffer layer, and forming a heavily doped source and a heavily doped drain respectively on one of the two outer sides of the poly-si layer; between the heavily doped source and the heavily doped drain is a channel, forming an isolation layer on the patterned poly-si layer, forming a gate layer on the isolation layer, with the gate layer comprising a first gate area and a second gate area, disposed in parallel, corresponding to the channel, forming an insulating layer on the gate layer, forming a source/drain pattern layer on the insulating layer, comprising a source pattern, a drain pattern and a bridge pattern, wherein the source pattern connects the heavily doped source; the drain pattern connects the heavily doped drain; one end of the bridge pattern connects the first gate area and the other end of the bridge pattern connects the second gate area.

Furthermore, steps after forming the patterned poly-si layer on the buffer layer and forming the heavily doped source and heavily doped drain respectively on one of the two outer sides of the poly-si layer further comprises: forming a first LDD area on the internal side of the heavily doped source; the first LDD area and the heavily doped source are electrically connected; forming a second LDD area on the internal side of the heavily doped drain; the second LDD area and the heavily doped drain are electrically connected; forming a third LDD in the middle of the channel, dividing the channel into a first channel area and a second channel area; the first and second channel areas electrically connect the third LDD area.

Furthermore, steps after forming the insulating layer on the gate layer further comprises: forming a first via hole on the insulating layer on the spot corresponding to the first gate area and the second gate area, and stuffing conductive materials in the first via hole; forming a source via hole on the insulating layer and the isolation layer on the spot corresponding to the heavily doped source, and stuffing conductive materials in the source via hole; forming a drain via hole on the insulating layer and the isolation layer on the spot corresponding to the heavily doped drain, and stuffing conductive materials in the drain via hole.

Different from existing technology, the present invention installs a bridge pattern on the source/drain pattern layer to connect the first gate area and second gate area, as if the width of the gate is widened. Therefore, the electrical resistance of the gate is reduced and the overall driving ability of TFT is increased. In addition, given that the bridge pattern is installed on the source/drain pattern layer, the distance between the bridge pattern and the patterned polycrystalline silicon (poly-si) layer is larger than the distance between the gate electrode and the patterned poly-si layer. Therefore, the bridge pattern has smaller influence on the leakage current of the patterned poly-si layer. Thus the driving ability of the TFT upgrades without affecting the leakage current, so the performance of the normally-operating TFT is not affected.

DETAILED DESCRIPTION OF PREFERRED EMBODIMENTS

The drawings illustrate embodiments of the invention and, together with the description, serve to explain the principles of the invention.

Figure 1:
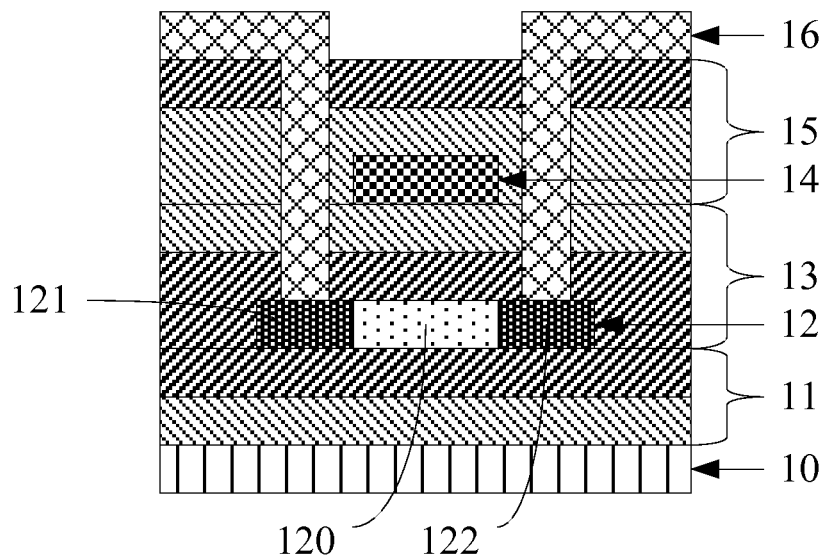
FIG. 1 shows a schematic diagram of a conventional LTPS N-TFT.
Figure 2:
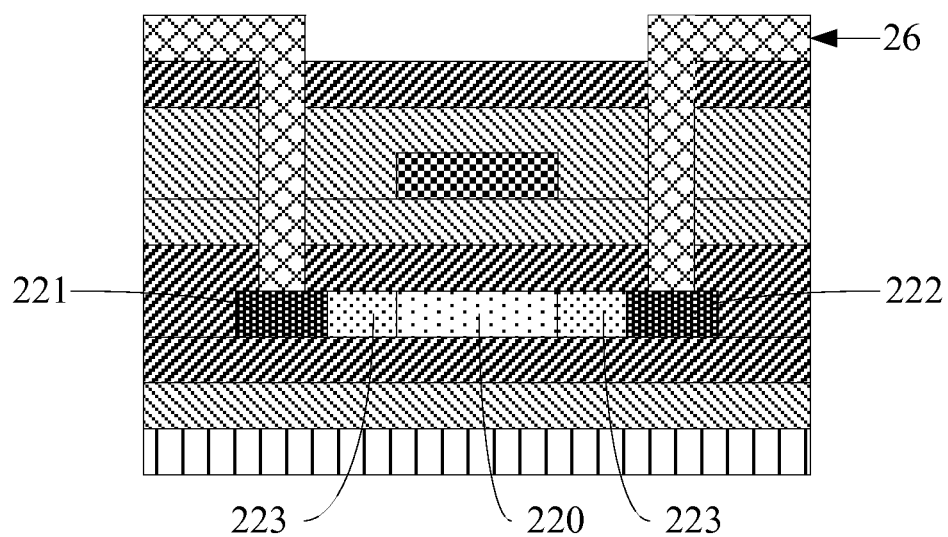
FIG. 2 shows a structure diagram of a conventional Lightly Doped Drain (LDD) Single-Gate N-type thin film transistor (N-TFT).
Figure 3:
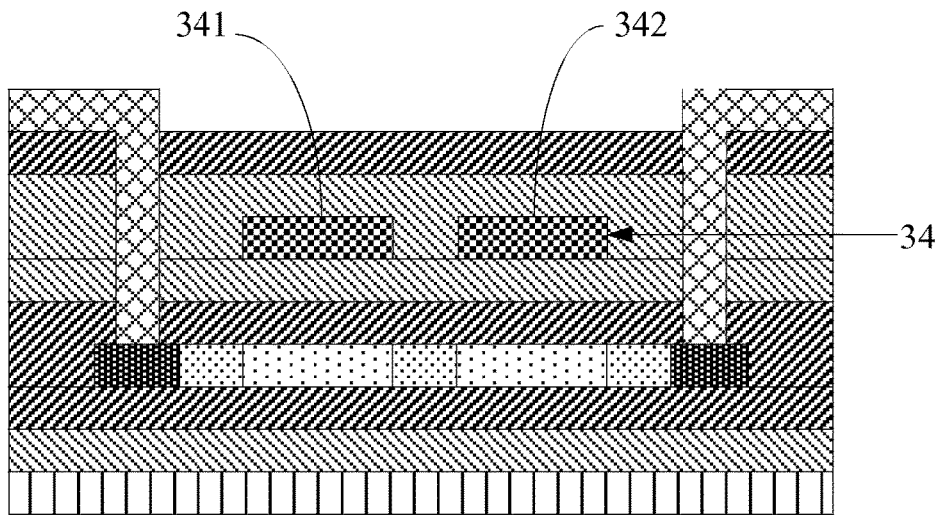
FIG. 3 shows a structure diagram of a conventional Lightly Doped Drain (LDD) Dual-Gate N-type thin film transistor.
Figure 4:
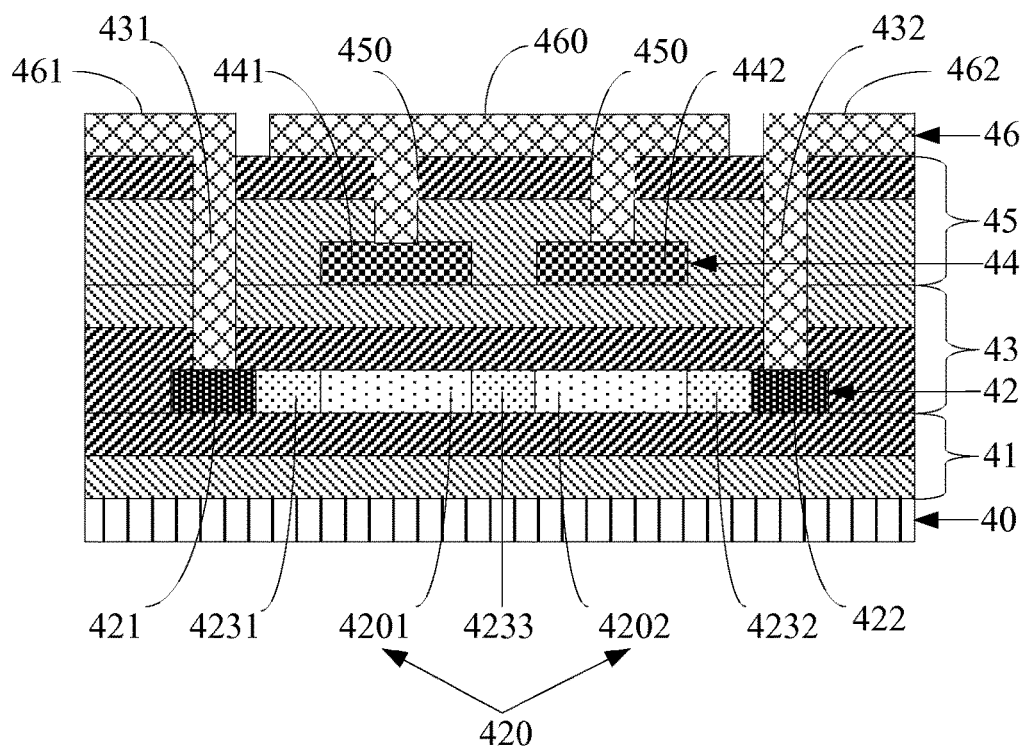
FIG. 4 shows a structure diagram of a TFT according to an embodiment of the present invention.

Please refer to FIG. 4, showing a structure diagram of a TFT according to an embodiment of the present invention.

The TFT of the present invention comprises a substrate 40, a buffer layer 41, a patterned poly-si layer 42, an isolation layer 43, a gate layer 44, an insulating layer 45 and a source/drain pattern layer 46.

The buffer layer 41 is disposed on the substrate 40, which can be made of glass. The material of this glass substrate is even, has high transparency, low reflectivity, and good thermal stability, so that it stays stable after multiple times of processing in high temperature. Given that a wide variety of chemical substances are involved in the manufacturing process of the TFT, the glass substrate must also have good chemical resistance. In addition, it also needs to have sufficient mechanical strength, good precision machine processing attributes and quality electrical insulating properties.

The buffer layer 41 can be made of silicon nitride (SiNx) or silicon dioxide (SiO2). The function of the buffer layer 41 is to isolate the substrate 40 and the patterned poly-si layer 42, so to prevent metal ions in the glass substrate to proliferate to the patterned poly-si layer 42, and lower the possibility of the formation of mura defect center and leakage current.

The patterned poly-si layer 42 is an active layer, disposed on the buffer layer 41. The patterned poly-si layer 42 comprises a heavily doped source 421 and heavily doped drain 422, disposed respectively on one of the two outer sides of the poly-si layer, and a channel 420 between the heavily doped source 421 and the heavily doped drain 422.

The dual-gate TFT of the present invention is an N-type TFT. The heavily doped source 421 and heavily doped drain 422 of the patterned poly-si layer 42 are doped with elements with five valence electrons (e.g. phosphorus). The channel 420 is not doped with impurities. An N-type semiconductor is formed if phosphorous element replaces silicon atom in the lattice. In an N-type semiconductor, free electron is the majority carrier and hole is the minority carrier and electricity is mainly conducted by free electrons. Free electrons are mainly provided by impurities. Holes are formed by thermal excitation. The more impurities are doped, the higher the density of majority carriers (free electrons), and the higher the conductivity.

The isolation layer 43 is also referred to as gate oxidation layer. It covers on the patterned poly-si layer 42 as an interface between the patterned poly-si layer 42 and the gate layer 44 so to isolate the patterned poly-si layer 42 and the gate layer 44. The isolation layer 43 can be made of SiNx, or a layer of SiNx with a layer of SiO2.

The gate layer 44 is disposed on the isolation layer 43. The gate layer 44 comprises a first gate area 441 and a second gate area 442, disposed in parallel and on the same level. They correspond to the channel 420. The gate layer 44 is usually made of materials such as aluminum or aluminum alloy.

The insulating layer 45 is covered on the gate layer 44. The insulating layer 45 can comprise one or two layers. The first layer can be silicon monoxide (SiO), silicon mononitride (SiN) or aluminum oxide (AlO), with a thickness ranging from 175 nm to 300 nm. The insulating layer 45 of the present embodiment comprises two layers: the first is a SiO2 film and the second is a SiNx film. The second layer is added to enhance the quality of the SiO2 film.

The source/drain pattern layer 46 is disposed on the insulating layer 45. The source/drain pattern layer 46 is usually made of aluminum alloy, aluminum metal or chromium metal. The source/drain pattern layer 46 comprises a source pattern 461, a drain pattern 462 and a bridge pattern 460. The source pattern 461 connects the heavily doped source 421, and the drain pattern 462 connects the heavily doped drain 422. The two ends of the bridge pattern 460 respectively connect the first gate area 441 and the second gate area 442. Source electrodes formed by the source pattern 461 connect pixel electrodes, and drain electrodes formed by the drain pattern 462 connect data lines.

Different from prior art, the present invention configures a bridge pattern on the source/drain pattern layer to connect the first gate area and second gate area, as if the width of the gate is widened. Therefore, the electrical resistance of the gate is reduced and the overall driving ability of TFT is increased. In addition, given that the bridge pattern is installed on the source/drain pattern layer, the distance between the bridge pattern and the patterned poly-si layer is larger than the distance between the gate electrode and the patterned poly-si layer. Therefore, the bridge pattern has smaller influence on the leakage current of the patterned poly-si layer. Thus the driving ability of the TFT is enhanced without affecting the leakage current, so the performance of the normally-operating TFT is not affected.

Please refer to FIG. 4. In another embodiment, the patterned poly-si layer 42 further comprises a first lightly doped drain (LDD) area 4231, a second LDD area 4232 and a third LDD area 4233. The first LDD area 4231 is located on the internal side of and electrically connected to the heavily doped source 421. The second LDD area 4232 is located on the internal side of and electrically connected to the heavily doped drain 422. The density of ions in lightly doped areas is less than that in heavy doping areas.

The channel 420 comprises a first channel area 4201 and a second channel area 4202. The first channel area 4201 is located on the internal side of and electrically connected to the first LDD area 4231. The second channel area 4202 is located on the internal side and electrically connected to the second LDD area 4232. The third LDD area 4233 is located between and electrically connects to the first channel area 4201 and second channel area 4202. The first gate area 441 corresponds to the first channel area 4201, and the second gate area 442 corresponds to the second channel area 4202.

The LDD structure is meant to reduce the electric field of drain areas and improve hot-electron degradation effects. It establishes a LDD area in the channel, so that the LDD area also undertakes part of the voltage to prevent hot-electron degradation effects. As the width of the gate reduces, so does the length of the channel under the gate structure. The reduction in the length of channels in transistors increases the possibility of charge to breakdown between the source and drain, and undesirable channel electrical current.

Therefore, the present embodiment establishes three LDD areas on the patterned poly-si layer 42, so the TFT has very small leakage current and its properties are improved.

A first via hole 450 is formed on the insulating layer 45 on the spot corresponding to the first gate area 441 and the second gate area 442. The first via hole is stuffed with conductive materials. One end of the bridge pattern 460 electrically connects the first gate area 441 through the conductive materials in the first via hole 450. The other end of the bridge pattern 460 electrically connects the second gate area 442 through the conductive materials in another first via hole 450. The bridge pattern 460 fully covers the first gate area 441 and second gate area 420. The width of the bridge pattern 460 is larger than or equal to the combined width of the first gate area 441, the third LDD area 4233 and the second gate area 442.

A source via hole 431 is formed on the insulating layer 43 and isolation layer 45 on the spot corresponding to the heavily doped source 421. The source via hole 431 is stuffed with conductive materials. The source pattern 461 electrically connects the heavily doped source 421 through the conductive materials in the source via hole 431.

A drain via hole 432 is formed on the insulating layer 43 and isolation layer 45 on the spot corresponding to the heavily doped drain 422. The drain via hole 432 is stuffed with conductive materials. The drain pattern 462 electrically connects the heavily doped drain 422 through the conductive materials in the drain via hole 432.

The present embodiment installs the bridge pattern on the source/drain pattern layer to connect the first gate area and second gate area, as if the width of the gate is widened. Therefore, the electrical resistance of the gate is reduced and the overall driving ability of TFT is increased. In addition, given that the bridge pattern is installed on the source/drain pattern layer, the distance between the bridge pattern and the patterned poly-si layer is larger than the distance between the gate electrode and the patterned poly-si layer. Therefore, the bridge pattern has smaller influence on the leakage current of the patterned poly-si layer. In addition, the present embodiment further installs three LDD areas, with intervals in between, on the patterned poly-si layer. Therefore, the TFT has a very small leakage current. When the TFT is turned on, because the driving electrical field of the gate electrode increased, the electrical passway in TFT channel forms faster, resulting in fast conduction current and conducting speed of the TFT. The driving ability of the TFT is enhanced without affecting the leakage current, so the performance of the normally-operating TFT is not affected.

Noted that the dual gate structure of the TFT of the present invention is also applicable to a P-type TFT. In most cases, the heavily doped source and heavily doped drain of a P-type TFT is doped with elements with three valence electrons (e.g. boron), so that they replace the silicon atoms in the lattice and form P-type semiconductors. In the P-type semiconductor, hole is the majority carrier and free electron is the minority carrier, thus electrical conduction mainly depends on holes. Holes are mainly provided by impurities, while free electrons are formed by thermal excitation. The more the impurities are doped, the higher the density of the majority carriers (holes), and the higher its conductivity.

Likewise, the P-type TFT installs the bridge pattern on the source/drain pattern layer. The bridge pattern connects the first gate area and second gate area, as if the width of the gate is widened. Therefore, the electrical resistance of the gate is reduced and the overall driving ability of TFT is increased. In addition, given that the bridge pattern is installed on the source/drain pattern layer, the distance between the bridge pattern and the patterned poly-si layer is larger than the distance between the gate electrode and the patterned poly-si layer. Therefore, the bridge pattern has smaller influence on the leakage current of the patterned poly-si layer. In addition, the present embodiment further installs three LDD areas, with intervals in between, on the patterned poly-si layer. Therefore, the TFT has a very small leakage current. When the TFT is turned on, because the driving electrical field of the gate electrode increased, the hole passway in TFT channel forms faster, resulting in fast conduction current and conducting speed of the TFT. The driving ability of the TFT is enhanced without affecting the leakage current, so the performance of the normally-operating TFT is not affected.

Figure 5:
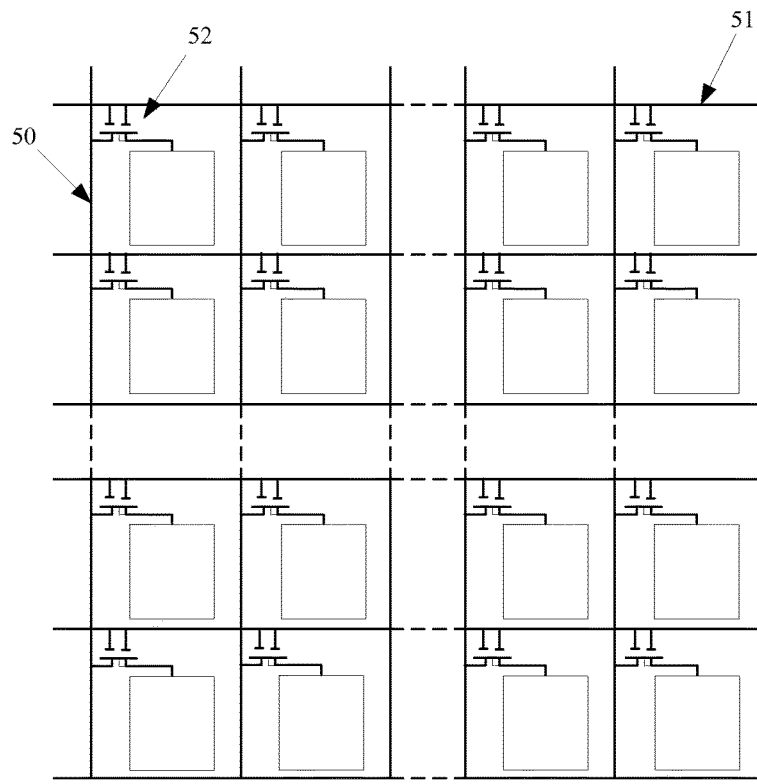
FIG. 5 shows a structure diagram of an array substrate of an embodiment of the present invention.

Please refer to FIG. 5, showing a structure diagram of an array substrate of an embodiment of the present invention.

The present invention further provides an array substrate, which comprises criss-crossing data lines 50, gate lines 51, and array-arranged TFTs 52 adopting any of the abovementioned embodiments.

Figure 6:
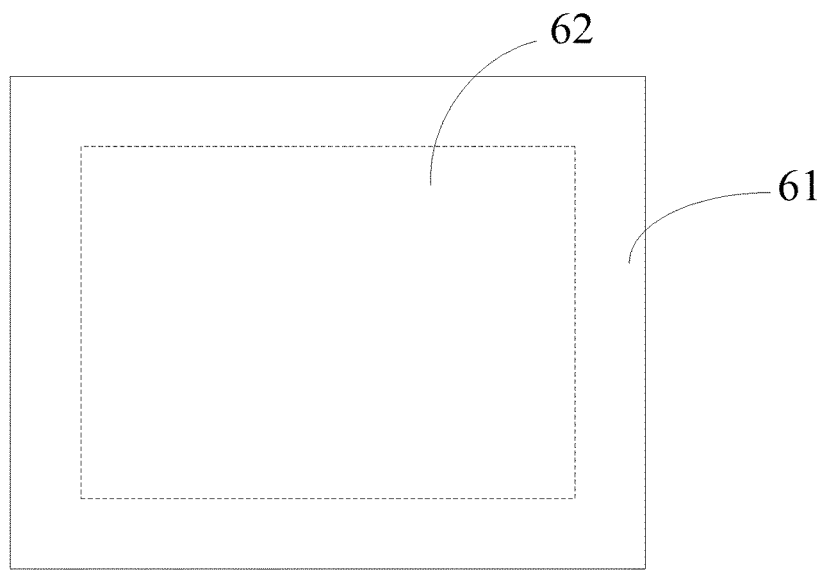
FIG. 6 shows a structure diagram of a display device according to an embodiment of the present invention.

Please refer to FIG. 6, showing a structure diagram of a display device of an embodiment of the present invention.

The present invention provides a display device, which comprises a casing 61 and the array substrate 62 mentioned above.

Figure 7:
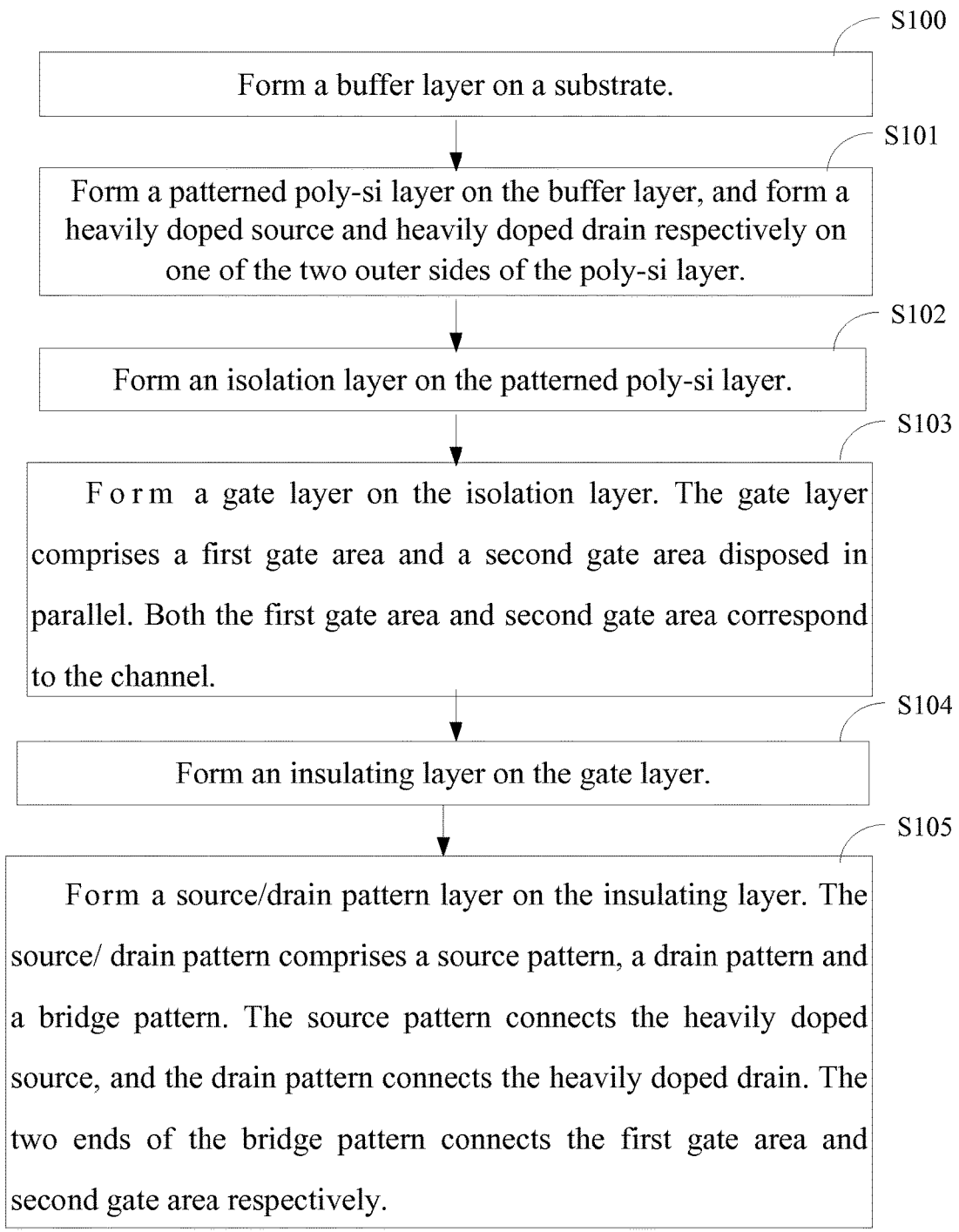
FIG. 7 shows a flow chart of a method of forming a TFT according to a first embodiment of the present invention.

Please refer to FIG. 7, showing a flow chart of a method of forming a TFT according to a first embodiment of the present invention.

Specifically, the method comprises the following steps:

Step 100: form a buffer layer on a substrate.

For example, the substrate is a glass substrate, and the buffer layer has a double-layer structure, with the bottom layer being SiNx and the upper layer being SiO2. The buffer layer is formed through chemical vapor deposition (CVD) or plasma-enhanced chemical vapor deposition (PECVD).

Step 101: form a patterned poly-si layer on the buffer layer, and form a heavily doped source and heavily doped drain respectively on one of the two outer sides of the poly-si layer. Between the heavily doped source and heavily doped drain is a channel.

The present step first forms an amorphous silicon (a-si) layer on the buffer layer, and then transforms the a-si layer into poly-si layer by excimer laser annealing or solid phase crystallization (SPC). The poly-si layer then is patterned through etching to form a patterned poly-si layer.

Coat photoresist on the patterned poly-si layer, then mark the areas where the heavily doped source and heavily doped drain need to be formed on the poly-si layer through exposure and development. Afterwards, implant ions through ion implantation method so to form the heavily doped source and heavily doped drain.

Step 102: form an isolation layer on the patterned poly-si layer.

The isolation layer referred to in the present step is a SiO2 layer and a SiNx layer formed by CVD or PECVD. The isolation layer is covered on the patterned poly-si layer as an interface between the patterned poly-si layer and the gate layer, so to isolate the patterned poly-si layer and the gate layer.

Step 104: form a gate layer on the isolation layer. The gate layer comprises a first gate area and a second gate area disposed in parallel. Both the first gate area and second gate area correspond to the channel.

The gate layer can be a metal alloy conductive layer comprising a plurality of layers of metals. It is usually made of aluminum or aluminum alloy, or is a metal alloy conductive layer formed by stacking layers of aluminum, tungsten, and chromium. The gate layer first forms a gate metal layer through physical vapor deposition (PVD), and then forms a pattered gate layer that is needed through etching or other techniques.

Step 105: form an insulating layer on the gate layer.

The insulating layer is the SiO2 layer and SiNx layer formed by CVD or PECVD. The insulating layer can also be a layer of SiO2, but usually, in order to enhance the quality of the insulating layer, another layer of SiNx is added on the SiO2 layer.

Step 106: form a source/drain pattern layer on the insulating layer. The source/drain pattern comprises a source pattern, a drain pattern and a bridge pattern. The source pattern connects the heavily doped source, and the drain pattern connects the heavily doped drain. The two ends of the bridge pattern connect the first gate area and second gate area respectively.

In the present embodiment, the source/drain pattern is formed by sputtering. For example, sputter metals such as aluminum or chromium to form a source/drain metal layer, and then etch it into the pattern needed. The pattern comprises a source pattern, a drain pattern and a bridge pattern.

The method of forming the TFT of the present invention, in the step of forming the source/drain pattern layer on the insulating layer, forms the source pattern, the drain pattern and the bridge pattern. One end of the bridge pattern connects the first gate area and the other end of the bridge pattern connects the second gate area, linking the source/drain pattern layer and the gate layer, as if the width of the gate is widened. Therefore, the electrical resistance of the gate is reduced and the overall driving ability of TFT is increased. In addition, given that the bridge pattern is installed on the source/drain pattern layer, the distance between the bridge pattern and the patterned poly-si layer is larger than the distance between the gate electrode and the patterned poly-si layer. Therefore, the bridge pattern has smaller influence on the leakage current of the patterned poly-si layer. Thus the driving ability of the TFT upgrades without affecting the leakage current, so the performance of the normally-operating TFT is not affected.

Figure 8:
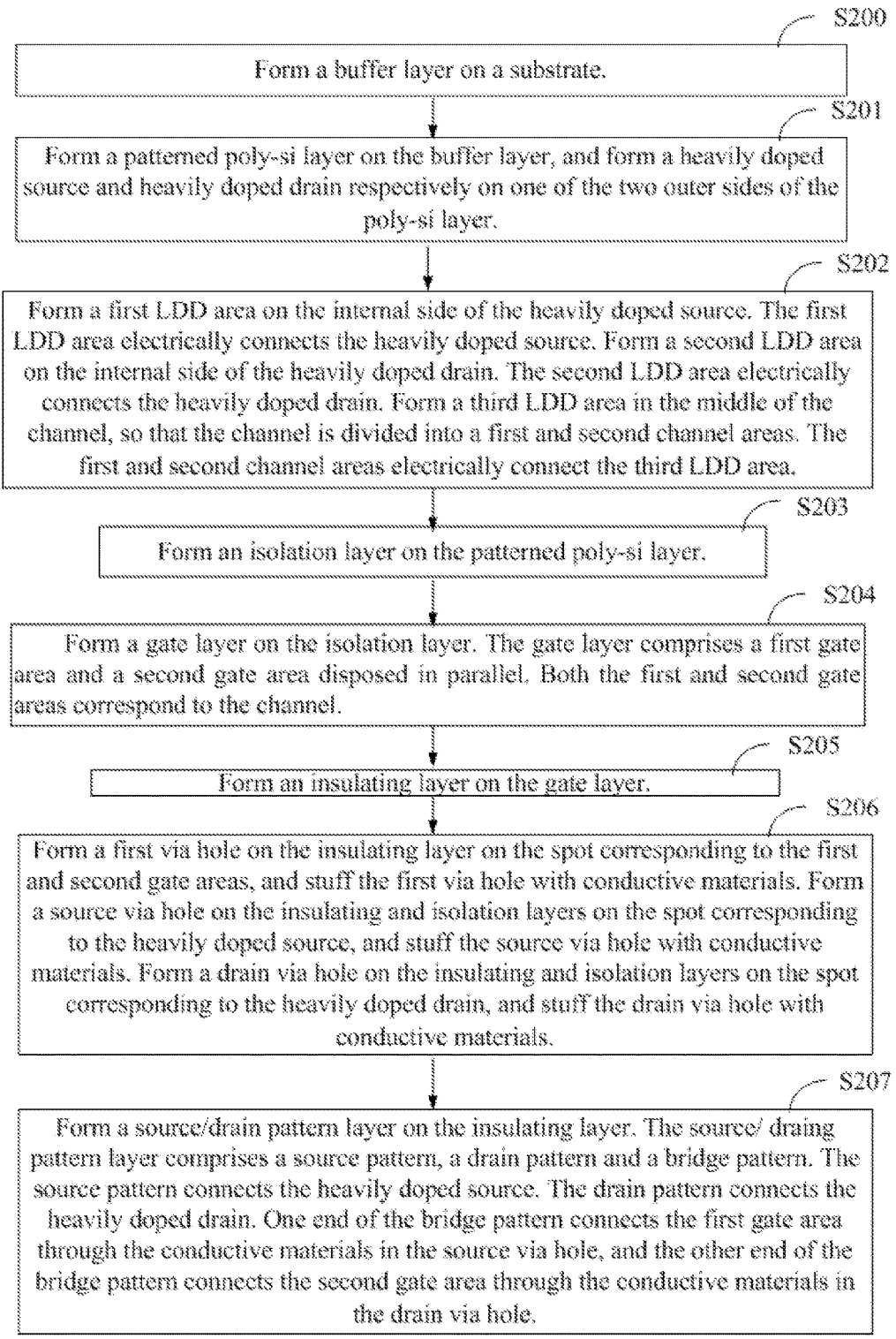
FIG. 8 shows a flow chart of a method of forming the TFT of a second embodiment of the present invention.

Please refer to FIG. 8, showing a flow chart of a method of forming the TFT of a second embodiment of the present invention.

Specifically, the method of forming the TFT of the present embodiment comprises the following steps:

Step 200: form a buffer layer on the substrate.

Step 201: form a patterned poly-si layer on the buffer layer, and form a heavily doped source and heavily doped drain on one of the two outer sides of the poly-si layer. Between the heavily doped source and heavily doped drain is a channel.

Step 202: form a first LDD area on the internal side of the heavily doped source. The first LDD area electrically connects the heavily doped source. Form a second LDD area on the internal side of the heavily doped drain. The second LDD area electrically connects the heavily doped drain. Form a third LDD area in the middle of the channel, so that the channel is divided into a first and second channel areas. The first and second channel areas electrically connect the third LDD area.

The present step coats photoresist on the patterned poly-si layer, and marks the areas where the first, second and third LDD areas must be formed on the patterned poly-si layer through exposure and development. Then, implant ions to these three areas so to form heavily doped sources and heavily doped drains through ion implantation method. The density of the ions implanted in the present step is lower than that used to form heavy doping areas.

Step 203: form an isolation layer on the patterned poly-si layer.

Step 204: form a gate layer on the isolation layer. The gate layer comprises a first gate area and a second gate area disposed in parallel. Both the first and second gate areas correspond to the channel.

Step 205: form an insulating layer on the gate layer.

Step 206: form a first via hole on the insulating layer on the spot corresponding to the first and second gate areas, and stuff the first via hole with conductive materials. Form a source via hole on the insulating and isolation layers on the spot corresponding to the heavily doped source, and stuff the source via hole with conductive materials. Form a drain via hole on the insulating and isolation layers on the spot corresponding to the heavily doped drain, and stuff the drain via hole with conductive materials.

The present step first coats photoresist on the insulating layer, and then removes the insulating layer from the spot where the first via hole must be formed through exposure and development. Then, stuff conductive materials into the first via hole. Likewise, coat photoresist on the insulating layer, and remove the insulating layer and isolation layer from spots where the source via hole and drain via hole must be formed, and stuff conductive materials into the source and drain via holes.

Step 207: form a source/drain pattern layer on the insulating layer. The source/drain pattern layer comprises a source pattern, a drain pattern and a bridge pattern. The source pattern connects the heavily doped source. The drain pattern connects the heavily doped drain. One end of the bridge pattern connects the first gate area through the conductive materials in the source via hole, and the other end of the bridge pattern connects the second gate area through the conductive materials in the drain via hole.

The method of forming the TFT of the present embodiment, in the step of forming the source/drain pattern layer on the insulating layer, forms the source pattern, the drain pattern and the bridge pattern. One end of the bridge pattern connects the first gate area and the other end of the bridge pattern connects the second gate area, linking the source/drain pattern layer and the gate layer, as if the width of the gate is widened. Therefore, the electrical resistance of the gate is reduced and the overall driving ability of TFT is increased. In addition, given that the bridge pattern is installed on the source/drain pattern layer, the distance between the bridge pattern and the patterned poly-si layer is larger than the distance between the gate electrode and the patterned poly-si layer. Therefore, the bridge pattern has smaller influence on the leakage current of the patterned poly-si layer. In addition, after the patterned poly-si layer is formed, the present embodiment further installs three LDD areas, with intervals in between, on the patterned poly-si layer. Therefore, the TFT has a very small leakage current. When the TFT is turned on, because the driving electrical field of the gate electrode increased, the electrical passway in TFT channel forms faster, resulting in fast conduction current and conducting speed of the TFT. The driving ability of the TFT is enhanced without affecting the leakage current, so the performance of the normally-operating TFT is not affected.

The present disclosure is described in detail in accordance with the above contents with the specific preferred examples. However, this present disclosure is not limited to the specific examples. For the ordinary technical personnel of the technical field of the present disclosure, on the premise of keeping the conception of the present disclosure, the technical personnel can also make simple deductions or replacements, and all of which should be considered to belong to the protection scope of the present disclosure.

What is claimed is:

1. A thin-film transistor (TFT), comprising:
   a substrate;
   a buffer layer on the substrate;
   a patterned polycrystalline silicon (poly-si) layer, disposed on the buffer layer, comprising a heavily doped source and a heavily doped drain disposed respectively on one of the two outer sides of the patterned poly-si layer, and a channel that is between the heavily doped source and the heavily doped drain;
   an isolation layer covered on the patterned poly-si layer;
   a gate layer, disposed on the isolation layer, comprising a first gate area and a second gate area disposed in parallel and corresponding to the channel;
   an insulating layer covered on the gate layer; and
   a source/drain pattern layer, disposed on the insulating layer, comprising a source pattern, a drain pattern and a bridge pattern, with the source pattern electrically connecting the heavily doped source, the drain pattern electrically connecting the heavily doped drain, and one end of the bridge pattern connecting the first gate area, and the other end of the bridge pattern connecting the second gate area.

2. The TFT of claim 1, wherein the patterned poly-si layer further comprises a first lightly doped drain (LDD) area, a second LDD area, and a third LDD area, with the first LDD area locating on the internal side of the heavily doped source and electrically connecting the heavily doped source area, and the second LDD area locating on the internal side of the heavily doped drain and electrically connecting the heavily doped drain;

the channel comprises a first channel area and a second channel area, with the first channel area locating on the internal side of the first LDD area and electrically connecting the first LDD area, the second channel area locating on the internal side of the second LDD area and electrically connecting the second LDD area, the third channel locating between the first channel area and the second channel area, and the third LDD area electrically connecting the first channel area and the second channel area.

3. The TFT of claim 2, wherein a first via hole is formed on the insulating layer on the spot corresponding to the first gate area and the second gate area; the first via hole is stuffed with conductive materials, by which the bridge pattern connects the first gate area and second gate area.

4. The TFT of claim 3, wherein the bridge pattern completely covers the first gate area and the second gate area.

5. The TFT of claim 2, wherein a source via hole is formed on the isolation layer and the insulating layer on the spot corresponding to the heavily doped source; the source via hole is stuffed with conductive materials, by which the source pattern electrically connects the heavily doped source;

a drain via hole is formed on the isolation layer and the insulating layer on the spot corresponding to the heavily doped drain; the drain via hole is stuffed with conductive materials, by which the drain pattern electrically connects the heavily doped drain.

6. An array substrate comprising a thin-film transistor (TFT), the TFT comprising:
a substrate;
a buffer layer on the substrate;
a patterned polycrystalline silicon (poly-si) layer, disposed on the buffer layer, comprising a heavily doped source and a heavily doped drain disposed respectively on one of the two outer sides of the patterned poly-si layer, and a channel that is between the heavily doped source and the heavily doped drain;
an isolation layer covered on the patterned poly-si layer;
a gate layer, disposed on the isolation layer, comprising a first gate area and a second gate area disposed in parallel and corresponding to the channel;
an insulating layer covered on the gate layer; and
a source/drain pattern layer, disposed on the insulating layer, comprising a source pattern, a drain pattern and a bridge pattern, with the source pattern electrically connecting the heavily doped source, the drain pattern electrically connecting the heavily doped drain, and one end of the bridge pattern connecting the first gate area, and the other end of the bridge pattern connecting the second gate area.

7. The array substrate of claim 6, wherein the patterned poly-si layer further comprises a first lightly doped drain (LDD) area, a second LDD area, and a third LDD area, with the first LDD area locating on the internal side of the heavily doped source and electrically connecting the heavily doped source area, and the second LDD area locating on the internal side of the heavily doped drain and electrically connecting the heavily doped drain;

the channel comprises a first channel area and a second channel area, with the first channel area locating on the internal side of the first LDD area and electrically connecting the first LDD area, the second channel area locating on the internal side of the second LDD area and electrically connecting the second LDD area, the third channel locating between the first channel area and the second channel area, and the third LDD area electrically connecting the first channel area and the second channel area.

8. The array substrate of claim 7, wherein a first via hole is formed on the insulating layer on the spot corresponding to the first gate area and the second gate area; the first via hole is stuffed with conductive materials, by which the bridge pattern connects the first gate area and second gate area.

9. The array substrate of claim 8, wherein the bridge pattern completely covers the first gate area and the second gate area.

10. The array substrate of claim 7, wherein a source via hole is formed on the isolation layer and the insulating layer on the spot corresponding to the heavily doped source; the source via hole is stuffed with conductive materials, by which the source pattern electrically connects the heavily doped source;

a drain via hole is formed on the isolation layer and the insulating layer on the spot corresponding to the heavily doped drain; the drain via hole is stuffed with conductive materials, by which the drain pattern electrically connects the heavily doped drain.

11. A method of forming a thin film transistor (TFT), comprising:
forming a buffer layer on a substrate;
forming a patterned polycrystalline silicon (poly-si) layer on the buffer layer, and forming a heavily doped source and a heavily doped drain respectively on one of the two outer sides of the poly-si layer; between the heavily doped source and the heavily doped drain is a channel;
forming an isolation layer on the patterned poly-si layer;
forming a gate layer on the isolation layer, with the gate layer comprising a first gate area and a second gate area, disposed in parallel, corresponding to the channel;
forming an insulating layer on the gate layer;
forming a source/drain pattern layer on the insulating layer, comprising a source pattern, a drain pattern and a bridge pattern, wherein the source pattern connects the heavily doped source; the drain pattern connects the heavily doped drain; one end of the bridge pattern connects the first gate area and the other end of the bridge pattern connects the second gate area.

12. The method of claim 11, wherein steps after forming the patterned poly-si layer on the buffer layer and forming the heavily doped source and heavily doped drain respectively on one of the two outer sides of the poly-si layer further comprises:
forming a first LDD area on the internal side of the heavily doped source; the first LDD area and the heavily doped source are electrically connected;
forming a second LDD area on the internal side of the heavily doped drain; the second LDD area and the heavily doped drain are electrically connected;
forming a third LDD in the middle of the channel, dividing the channel into a first channel area and a second channel area; the first and second channel areas electrically connect the third LDD area.

13. The method of claim 12, wherein steps after forming the insulating layer on the gate layer further comprises:
  forming a first via hole on the insulating layer on the spot corresponding to the first gate area and the second gate area, and stuffing conductive materials in the first via hole;
  forming a source via hole on the insulating layer and the isolation layer on the spot corresponding to the heavily doped source, and stuffing conductive materials in the source via hole;
  forming a drain via hole on the insulating layer and the isolation layer on the spot corresponding to the heavily doped drain, and stuffing conductive materials in the drain via hole.

* * * * *